(12) United States Patent
Ohkubo et al.

(10) Patent No.: US 11,476,137 B2
(45) Date of Patent: Oct. 18, 2022

(54) DIVIDING APPARATUS INCLUDING AN IMAGING UNIT FOR DETECTING DEFECTS IN A WORKPLACE

(71) Applicant: DISCO CORPORATION, Tokyo (JP)

(72) Inventors: Hironari Ohkubo, Tokyo (JP); Ken Jou, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 299 days.

(21) Appl. No.: 16/850,841

(22) Filed: Apr. 16, 2020

(65) Prior Publication Data

US 2020/0335370 A1 Oct. 22, 2020

(30) Foreign Application Priority Data

Apr. 18, 2019 (JP) .............................. JP2019-079240

(51) Int. Cl.
*H01L 21/67* (2006.01)
*B28D 5/00* (2006.01)
*H01L 23/544* (2006.01)
*B23K 26/53* (2014.01)

(52) U.S. Cl.
CPC ........ *H01L 21/67282* (2013.01); *B23K 26/53* (2015.10); *B28D 5/0064* (2013.01); *B28D 5/0094* (2013.01); *H01L 21/67092* (2013.01); *H01L 23/544* (2013.01); *H01L 2223/5446* (2013.01)

(58) Field of Classification Search
CPC ............ H01L 21/67282; H01L 23/544; B28D 5/0064; B28D 5/0094
USPC .................................... 438/462, 464; 83/73
See application file for complete search history.

(56) References Cited

U.S. PATENT DOCUMENTS 7,655,541 B2 * 2/2010 Oba ...................... B23K 26/40
  438/458
10,807,198 B2 * 10/2020 Ban ................... H01L 21/67092

FOREIGN PATENT DOCUMENTS

JP 2018152380 A 9/2018

* cited by examiner

*Primary Examiner* — Quoc D Hoang
(74) *Attorney, Agent, or Firm* — Greer, Burns & Crain, Ltd.

(57) ABSTRACT

A dividing apparatus includes a table having a transparent plate having a holding surface for holding a workpiece thereon and a lower illumination unit for illuminating the holding surface from below, a first storage section for storing a first image including a white portion where illumination light from the lower illumination unit is transmitted through the workpiece and displayed as white and a black portion where the illumination light is blocked by the workpiece and displayed as black when an image of a kerf defined by a dividing unit in the workpiece held on the holding surface is captured by an image capturing unit with the lower illumination unit being energized, and a white pixel detecting section for detecting whether or not there are pixels in the white portion of the first image in directions perpendicular to directions along which a street extends.

4 Claims, 9 Drawing Sheets

DIVIDING APPARATUS INCLUDING AN IMAGING UNIT FOR DETECTING DEFECTS IN A WORKPLACE

BACKGROUND OF THE INVENTION

Field of the Invention

The present invention relates to a dividing apparatus for dividing a workpiece such as a semiconductor wafer or the like into device chips along streets of the workpiece.

Description of the Related Art

In case a dividing process is performed on a wafer on which devices are formed in respective areas demarcated by dicing lines called streets to divide the wafer into device chips along the streets, it is customary to confirm whether or not dividing grooves or kerfs extend through the wafer between upper and lower surfaces thereof (see, for example, Japanese Patent Laid-open No. 2018-152380). Specifically, it is confirmed whether or not the dividing grooves extend through the wafer between the upper and lower surfaces by applying light to the wafer from one surface side, e.g., an upper surface side, capturing an image of the other surface, e.g., the lower surface, of the wafer with an image capturing unit, and determining whether or not the light has passed through the dividing grooves and the dividing grooves appear as white areas in the captured image.

SUMMARY OF THE INVENTION

According to the process disclosed in Japanese Patent Laid-open No. 2018-152380, however, the wafer that has been processed by the dividing process is separated from the chuck table of a dividing apparatus, and then, light is applied to the wafer in order to confirm the dividing grooves. Therefore, if it has been confirmed that the dividing grooves do not extend through the wafer between the upper and lower surfaces, then it is difficult to perform the dividing process again on the wafer to make the dividing grooves extend through the wafer between the upper and lower surfaces.

It is therefore an object of the present invention to provide a dividing apparatus that makes it possible to confirm whether or not a workpiece on a chuck table has been completely severed or can be completely severed by dividing grooves, i.e., kerfs, extending through the workpiece between upper and lower surfaces thereof and having an appropriate width, after or before the workpiece is divided into device chips along streets of the workpiece.

In accordance with an aspect of the present invention, there is provided a dividing apparatus including a chuck table having a holding surface for holding thereon a workpiece including devices formed in respective areas demarcated by streets, a dividing unit for forming kerfs in the workpiece along the streets while the workpiece is being held on the chuck table to fragmentize the workpiece into device chips, an X-axis feed unit for process-feeding the chuck table and the dividing unit relatively in X-axis directions parallel to directions along which the streets extend, a Y-axis feed unit for index-feeding the chuck table and the dividing unit relatively in Y-axis directions perpendicular to the X-axis directions in a horizontal plane, an image capturing unit for capturing an image of at least one of the kerfs from above the workpiece held on the chuck table, wherein the chuck table includes a transparent plate made of a transparent material and having an upper surface and suction ports providing fluid communication between the upper surface and a suction source to cause the upper surface to function as a holding surface, a base supporting the transparent plate thereon, and a lower illumination unit disposed between the transparent plate and the base for illuminating the holding surface, a first storage section for storing a first image including a white portion where illumination light from the lower illumination unit is transmitted through the workpiece and displayed as white and a black portion where the illumination light is blocked by the workpiece and displayed as black when an image of a kerf defined by the dividing unit in the workpiece held on the holding surface is captured by the image capturing unit with the lower illumination unit being energized, a white pixel detecting section for detecting whether or not there are pixels in the white portion of the first image in directions perpendicular to directions along which a street extends, and a deciding section for deciding that the kerf is defective if the white pixel detecting section does not detect white pixels and the kerf is formed normally if the white pixel detecting section detects white pixels.

Preferably, the dividing apparatus further includes a first measuring section for counting pixels in the white portion of the first image in the directions perpendicular to the directions in which the street extends and measuring the width of the white portion, and a first deciding section for deciding that the kerf is defective if a first measured width measured by the first measuring section is smaller than a preset first width, that the kerf is defective if the first measured width exceeds a preset second width, and that the kerf is formed normally if the first measured width is in the range from the preset first width to the preset second width.

Preferably, the dividing apparatus further includes an upper illumination unit for illuminating the workpiece held on the chuck table from above the workpiece, a second storage section for storing a second image including a black portion that represents the kerf displayed black when an image of the kerf is captured by the image capturing unit from above the workpiece while the upper illumination unit is being energized and the lower illumination unit is being de-energized, a second measuring section for counting pixels in the black portion of the second image in the directions perpendicular to the directions along which the street extends and measuring the width of the kerf in the upper surface of the workpiece, and a second deciding section for deciding whether the kerf is formed vertically from the upper surface of the workpiece to the lower surface thereof or is formed obliquely on the basis of the measured result from the first measuring section and the measured result from the second measuring section.

Preferably, the dividing apparatus further includes a third deciding section for deciding whether or not upper and lower areas of the kerf can be brought into the width of the street even though the kerf has a gradient when the second deciding section decides that the kerf is formed obliquely, wherein if the third deciding section decides that the upper and lower areas of the kerf can be brought into the width of the street, a Y-axis control process is performed for moving the chuck table and the dividing unit relatively in the Y-axis directions in order to bring the upper and lower areas of the kerf into the width of the street.

In the dividing apparatus according to the aspect of the present invention, the chuck table includes a transparent plate made of a transparent material and having an upper surface and suction ports providing fluid communication between the upper surface and a suction source to cause the upper surface to function as a holding surface, a base supporting the transparent plate thereon, and a lower illumination unit disposed between the transparent plate and the base for illuminating the holding surface. The dividing apparatus includes a first storage section for storing a first image including a white portion where illumination light from the lower illumination unit is transmitted through the workpiece and displayed as white and a black portion where the illumination light is blocked by the workpiece and displayed as black when an image of a kerf defined by the dividing unit in the workpiece held on the holding surface is captured by the image capturing unit with the lower illumination unit being energized, a white pixel detecting section for detecting whether there are pixels in the white portion of the first image in directions perpendicular to directions along which a street extends or not, and a deciding section for deciding that the kerf is defective if the white pixel detecting section does not detect white pixels and the kerf is formed normally if the white pixel detecting section detects white pixels. It is thus possible to confirm whether the kerf defined in an excess outer circumferential region, for example, of the workpiece held on the chuck table extends through the workpiece W between the upper and lower surfaces thereof or not. Thereafter, an appropriate dividing process can be performed on the workpiece using the decided result.

In case the dividing apparatus also includes a first measuring section for counting pixels in the white portion of the first image in the directions perpendicular to the directions in which the street extends and measuring the width of the white portion, and a first deciding section for deciding that the kerf is defective if the first measured width measured by the first measuring section is smaller than a preset first width, that the kerf is defective if the first measured width exceeds a preset second width, and that the kerf is formed normally if the first measured width is in the range from the preset first width to the preset second width, it is possible to confirm whether the kerf defined in the excess outer circumferential region, for example, of the workpiece held on the chuck table extends through the workpiece between the upper and lower surfaces thereof or not and whether the kerf is formed with an appropriate width or not. Thereafter, an appropriate dividing process can be performed on the workpiece using the decided results.

Furthermore, in case the dividing apparatus includes an upper illumination unit for illuminating the workpiece held on the chuck table from above the workpiece, a second storage section for storing a second image including a black portion that represents the kerf displayed black when an image of the kerf is captured by the image capturing unit from above the workpiece while the upper illumination unit is being energized and the lower illumination unit is being de-energized, a second measuring section for counting pixels in the black portion of the second image in the directions perpendicular to the directions along which the street extends and measuring the width of the kerf in the upper surface of the workpiece, and a second deciding section for deciding whether the kerf is formed vertically from the upper surface of the workpiece to the lower surface thereof or is formed obliquely on the basis of the measured result from the first measuring section and the measured result from the second measuring section, it is possible to confirm, prior to a process of actually dividing the workpiece into device chips, for example, whether the kerf is formed vertically in the workpiece held on the chuck table from the upper surface of the workpiece to the lower surface thereof or not.

In case the dividing apparatus includes a third deciding section for deciding whether upper and lower areas of the kerf can be brought into the width of the street even though the kerf has a gradient when the second deciding section decides that the kerf is formed obliquely, if the third deciding section decides that the upper and lower areas of the kerf can be brought into the width of the street, a Y-axis control process is performed for moving the chuck table and the dividing unit relatively in the Y-axis directions in order to bring the upper and lower areas of the kerf into the width of the street. Therefore, the upper and lower areas of the kerf are brought into the width of the street of the workpiece held on the chuck table, making it possible for the dividing unit to process the workpiece subsequently.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
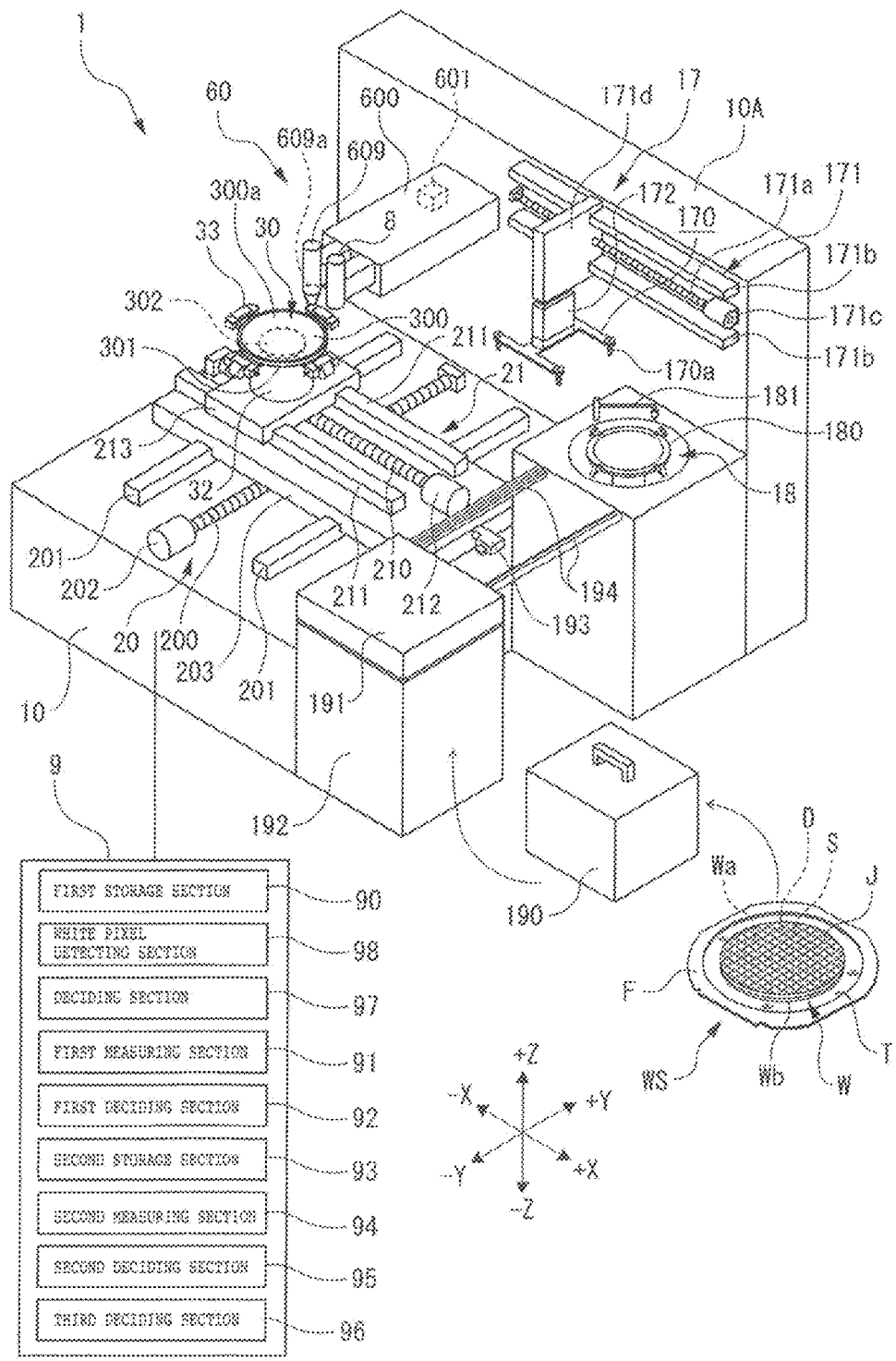
FIG. 1 is a perspective view illustrating by way of example a dividing apparatus according to an embodiment of the present invention.

As illustrated in FIG. 1, a dividing apparatus 1 according to a preferred embodiment of the present invention is an apparatus for dividing a workpiece W, for example, held on a chuck table 30 by applying a laser beam to the workpiece W to process the workpiece W by way of ablation, for example. The dividing apparatus 1 may alternatively be a cutting apparatus for cutting a workpiece W with a rotating cutting blade to form kerfs in the workpiece W along a grid of streets S thereon.

Figure 2:
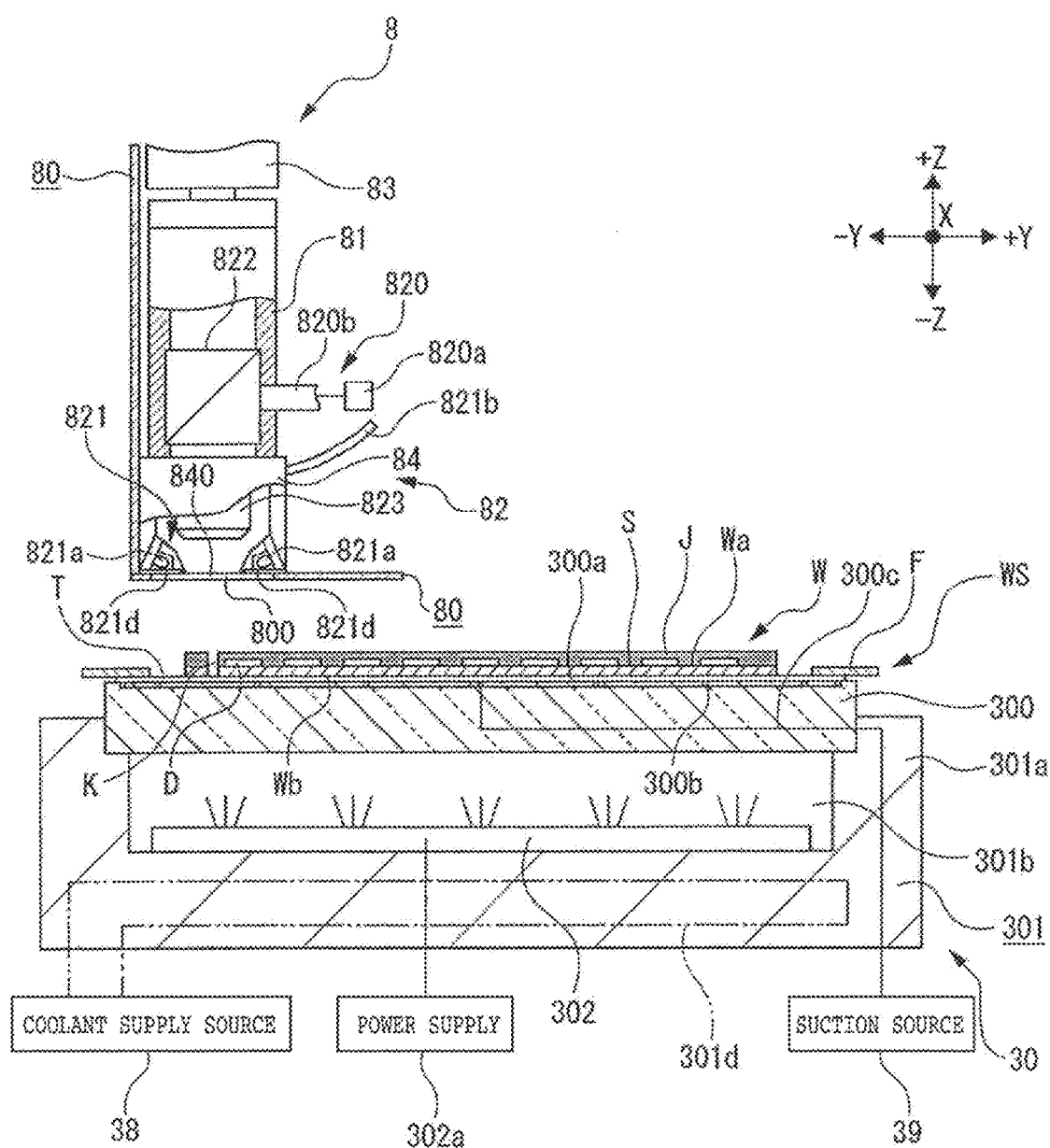
FIG. 2 is a cross-sectional view of a portion of the dividing apparatus, illustrating the manner in which a lower illumination unit is energized and a kerf in a workpiece is imaged by an image capturing unit.

The workpiece W illustrated in FIGS. 1 and 2 is, for example, a circular semiconductor wafer made of a base material of silicon that includes a plurality of perpendicularly crossing streets S formed on a face side Wa thereof that faces upwardly in FIG. 1 and a plurality of devices D such as integrated circuits (ICs) or the like formed in a grid of respective areas demarcated by the streets S. The workpiece W may be made of gallium arsenide, sapphire, ceramics, resin, gallium nitride, silicon carbide, or the like, rather than silicon. An interconnect layer, not depicted, is deposited on the devices D on the face side Wa of the workpiece W. The face side Wa with the streets S and the devices D thereon is encapsulated by a resin layer J.

The workpiece W may be a plate-shaped wafer not encapsulated by the resin layer J.

The workpiece W has a reverse side Wb that faces downwardly to which there is stuck a circular dicing tape T, for example. The dicing tape T has an outer circumferential portion stuck to a ring frame F. Therefore, the workpiece W is supported on the ring frame F by the dicing tape T, the entire assembly being referred to as a work set WS that can be handled with the ring frame F.

The dividing apparatus 1 has a base table 10 on which there is mounted a Y-axis feed unit 20 for moving a chuck table 30 reciprocably in Y-axis directions, which are also referred to as index-feeding directions. The Y-axis feed unit 20 includes a ball screw 200 having an axis extending in the Y-axis directions, a pair of guide rails 201 extending parallel to the ball screw 200 on both sides thereof, an electric motor 202 connected to an end of the ball screw 200 for rotating the ball screw 200 about its own axis, and a movable plate 203 having an internal nut threaded over the ball screw 200 and a bottom held in sliding contact with the guide rails 201.

When the electric motor 202 rotates the ball screw 200 about its own axis, the movable plate 203 moves in one of the Y-axis directions while being guided by the guide rails 201, causing the chuck table 30 disposed on the movable plate 203 by an X-axis feed unit 21 to move therewith in the one of the Y-axis directions.

The X-axis feed unit 21 moves the chuck table 30 reciprocably in X-axis directions, which are also referred to as process-feeding directions, perpendicular to the Y-axis directions on a horizontal plane. The X-axis feed unit 21 includes a ball screw 210 having an axis extending in the X-axis directions, a pair of guide rails 211 extending parallel to the ball screw 210 on both sides thereof, an electric motor 212 connected to an end of the ball screw 210 for rotating the ball screw 210 about its own axis, and a movable plate 213 having an internal nut threaded over the ball screw 210 and a bottom held in sliding contact with the guide rails 211. When the electric motor 212 rotates the ball screw 210 about its own axis, the movable plate 213 moves in one of the X-axis directions while being guided by the guide rails 211, causing the chuck table 30 disposed on the movable plate 213 to move therewith in the one of the X-axis directions.

The chuck table 30 illustrated in FIGS. 1 and 2 holds the work set WS thereon. The chuck table 30, which has a circular outer profile as viewed in plan, includes at least a transparent plate 300 made of a transparent material and having an upper surface and a plurality of suction ports 300b providing fluid communication between the upper surface and a suction source 39 to cause the upper surface to function as a holding surface 300a for holding the work set WS thereon, a base 301 supporting the transparent plate 300 thereon, and a lower illumination unit 302 disposed between the transparent plate 300 and the base 301 for illuminating the holding surface 300a.

The transparent plate 300 is in the form of a transparent material made of glass, acryl, or the like, shaped as a circular plate as viewed in plan, and has a flat upper surface functioning as the holding surface 300a. The holding surface 300a has the suction ports 300b defined therein at circumferentially and radially equally spaced intervals and extending downwardly in a −Z-axis direction into the transparent plate 300. The suction ports 300b are joined to a single suction channel 300c defined in the transparent plate 300.

The holding surface 300a may have a plurality of annular suction grooves defined therein concentrically around the center of rotation of the chuck table 30 and a plurality of radial joint grooves defined therein that extend radially at circumferentially equally spaced intervals to interconnect the suction grooves. The suction ports 300b may be defined at the bottoms of the suction grooves and the joint grooves.

The base 301 that supports the transparent plate 300 thereon is of a circular shape as viewed in plan. The base 301 includes an annular wall 301a extending upwardly to a predetermined height from the outer circumferential edge of an upper surface thereof. The base 301 includes an empty region defined radially inwardly of the annular wall 301a as a cavity 301b that houses the lower illumination unit 302 therein.

The annular wall 301a has an upper surface as a stepped surface having a radially inward step. The transparent plate 300 has an outer circumferential edge including a lower portion fitted in the stepped surface of the annular wall 301a. A space is defined between the lower illumination unit 302 that is mounted on the bottom surface of the cavity 301b and the transparent plate 300.

The lower illumination unit 302 is disposed in confronting relation to the transparent plate 300 in Z-axis directions. The lower illumination unit 302 illuminates the workpiece W of the work set WS held under suction on the holding surface 300a with light emitted from the lower illumination unit 302 and transmitted through the transparent plate 300 and the dicing tape T. The lower illumination unit 302 includes a plurality of light emitting diodes (LEDs), for example. However, the lower illumination unit 302 may include a xenon lamp or the like, rather than the LEDs. The lower illumination unit 302 emits light when energized by a power supply 302a electrically connected thereto, and applies the emitted light to the workpiece W where the light travels from the reverse side Wb toward the face side Wa.

The suction channel 300c defined in the transparent plate 300 extends into the base 301 and downwardly through the base 301 to a bottom surface thereof where the suction channel 300c has an open lower end. The open lower end of the suction channel 300c is held in fluid communication with the suction source 39, such as an ejector mechanism, a vacuum generator, or the like, through a metal pipe or a flexible resin tube.

The base 301 has a coolant conduit 301d defined therein for carrying a coolant flowing therethrough. The coolant conduit 301d is connected to a coolant supply source 38. When the coolant supply source 38 supplies a coolant to the coolant conduit 301d, the coolant circulates through the coolant conduit 301d, cooling the base 301 from inside. For example, when the lower illumination unit 302 is generating heat by application of light, the coolant supplied from the coolant supply source 38 and flowing through the coolant conduit 301d keeps the chuck table 30 at an appropriate temperature.

As illustrated in FIG. 1, the chuck table 30 is rotatable about its own axis by a rotary unit 32 mounted on the movable plate 213 and coupled to a bottom surface of the chuck table 30. The rotary unit 32 has a vertical axis aligned with the axis of the chuck table 30 along the Z-axis directions, i.e., vertical directions. Four fixing clamps 33 that are circumferentially equally spaced are disposed around the chuck table 30 for securing the ring frame F.

A cassette table 191 for placing a cassette 190 that holds a plurality of work sets WS in respective shelves is disposed on a front side, which faces in a −Y-axis direction, of the dividing apparatus 1. The cassette table 191 is disposed on a cassette elevator 192 that moves reciprocably in the Z-axis directions to adjust the height of the cassette table 191.

A centering guide 194 having a pair of guide rails for positioning a work set WS drawn out of the cassette 190 in alignment with a certain position is disposed behind the cassette table 191. The guide rails, each having an L-shaped cross section and extending in the Y-axis directions, are movable toward or away from each other in the X-axis directions, and have stepped guide surfaces, i.e., inner surfaces, facing each other. For loading a workpiece W onto the chuck table 30, a work set WS is drawn from the cassette 190 by a push-pull mechanism 193 depicted in FIG. 1 and placed on the centering guide 194. After a work set WS is processed and cleaned, the work set WS is placed on the centering guide 194 and pushed into the cassette 190 by the push-pull mechanism 193.

When a work set WS is placed on the centering guide 194, the guide rails of the centering guide 194 are moved toward each other and support the outer circumferential edge of the ring frame F of the work set WS. The centering guide 194 positions, i.e., centers, the work set WS with respect to the chuck table 30.

The dividing apparatus 1 includes an upstanding column 10A disposed on a rear side, which faces in a+Y-axis direction, of the base table 10. A dividing unit 60 is disposed on the column 10A.

The dividing unit 60 has a casing 600 in the shape of substantially rectangular parallelepiped, for example. The casing 600 extends horizontally in the −Y-axis direction from the column 10A. The dividing unit 60 also has a beam applying head 609 mounted on a distal end of the casing 600.

The casing 600 houses therein a laser oscillator 601 such as a YAG pulse laser or the like, for example. The laser oscillator 601 emits a laser beam horizontally toward a mirror, not depicted, that reflects the laser beam into a −Z-axis direction toward a condensing lens 609a in the beam applying head 609. The condensing lens 609a focuses and applies the laser beam to the workpiece W held on the chuck table 30. The height or vertical position of a focused spot of the laser beam can be adjusted in the Z-axis directions by a focus position adjusting unit, not depicted.

An image capturing unit 8 for capturing an image of a kerf in the workpiece W held on the chuck table 30 from above the workpiece W is disposed on the distal end of the casing 600 in juxtaposed relation to the beam applying head 609 in the X-axis directions.

The image capturing unit 8 is also used to perform an alignment process such as a pattern matching process or the like for recognizing coordinate positions of the streets S of the workpiece W to which the laser beam is to be applied, when kerfs are to be formed in the workpiece W held under suction on the chuck table 30.

As illustrated in FIG. 2, the image capturing unit 8 is mounted in an image capturing unit cover 80, not depicted in FIG. 1, mounted on the distal end of the casing 600. The image capturing unit cover 80 has an opening 800 defined in a bottom panel thereof. The image capturing unit 8 receives light reflected from the workpiece W and transmitted upwardly through the opening 800 and light emitted from the lower illumination unit 302 and transmitted upwardly through the transparent plate 300, the workpiece W, and the opening 800.

The image capturing unit 8 includes a tubular housing 81 for blocking external light and an upper illumination unit 82 for illuminating the workpiece W held on the chuck table 30 with light from above. The upper illumination unit 82 includes a coaxial epi-illumination unit 820 mounted on a side surface of the housing 81. The coaxial epi-illumination unit 820 includes, for example, a light source 820a such as an LED, a xenon lamp, or the like and a transmission optical system 820b such as an optical fiber or the like for propagating light emitted from the light source 820a into the housing 81. The amount of light emitted from the light source 820a can be adjusted by a voltage regulator or the like, not depicted.

The image capturing unit 8 also includes a half-silvered mirror 822 disposed in the housing 81 for reflecting light applied from the coaxial epi-illumination unit 820 thereby to change the direction of the light downwardly, an objective lens 823 disposed in the housing 81 below the half-silvered mirror 822 for receiving the light reflected by the half-silvered mirror 822, and an image capturing device 83 disposed above the half-silvered mirror 822 for photoelectrically converting light reflected by the workpiece W, for example, and captured by the objective lens 823 into an electric signal and outputting the electric signal as image information.

The half-silvered mirror 822 has a function to reflect and guide the light from the coaxial epi-illumination unit 820 toward the workpiece W and a function to transmit and guide the reflected light from the workpiece W toward the image capturing device 83. The objective lens 823 has an optical axis perpendicular to the holding surface 300*a* of the chuck table 30. Therefore, the light from the coaxial epi-illumination unit 820 is reflected by the half-silvered mirror 822 to travel parallel to the optical axis of the objective lens 823 and through the objective lens 823 to illuminate the face side Wa of the workpiece W directly from above.

An illumination case 84 for obliquely illuminating the workpiece W from above is disposed in a lower portion of the housing 81 of the image capturing unit 8. The illumination case 84 has an image capturing opening 840 defined centrally in a bottom surface thereof. The upper illumination unit 82 also includes a plurality of light emitters 821*a* such as LEDs, for example, disposed at predetermined spaced intervals in circumferential directions on a lower portion of an inner side surface of the illumination case 84. The light emitters 821*a* surround the image capturing opening 840, providing an oblique illumination unit 821 for emitting and applying light to the workpiece W obliquely from above. A power supply, not depicted, is electrically connected to each of the light emitters 821*a* through a power supply cable 821*b* extending in the illumination case 84. The bottom surface of the illumination case 84 is provided by a transparent ring plate 821*d*. The light emitted from the light emitters 821*a* travels through the ring plate 821*d* and is applied to the upper surface of the workpiece W at an angle smaller or larger than the right angle.

The image capturing unit 8 captures an image of the face side Wa of the workpiece W while the face side Wa is being illuminated with light applied uniformly directly from above by the coaxial epi-illumination unit 820 of the upper illumination unit 82 and is also being illuminated with light applied three-dimensionally obliquely from above by the oblique illumination unit 821 of the upper illumination unit 82.

The image capturing device 83 illustrated in FIG. 2 receives light reflected from the workpiece W through the objective lens 823 when the workpiece W is illuminated with light from the coaxial epi-illumination unit 820 and the oblique illumination unit 821.

The image capturing device 83 includes a plurality of photodetectors such as charge-coupled devices (CCDs) or the like arranged in a two-dimensional array, for example. Data represented by the intensities of light detected by respective pixels of the photodetectors of the image capturing device 83 indicate luminance values in 8-bit grayscale levels, i.e., in 256 grayscale levels in a range of 0 to 255 grayscale levels, for example.

However, the image capturing unit 8 is not limited to the structure described in the present embodiment.

As illustrated in FIG. 1, for example, the dividing apparatus 1 includes a delivery unit 17 for unloading a processed workpiece W from the chuck table 30. The delivery unit 17 includes a delivery pad 170 for holding a work set WS through a ring frame F thereof, a delivery pad moving unit 171 for moving the delivery pad 170 in the X-axis directions, and a lifting and lowering unit 172 for lifting and lowering the delivery pad 170.

The delivery pad 170 has an H-shaped outer profile as viewed in plan, for example. The lifting and lowering unit 172 has a lower end attached to an upper surface of the delivery pad 170. The delivery pad 170 has four suction cups 170*a* mounted on a lower surface thereof for attracting the ring frame F under suction. The suction cups 170*a* are held in fluid communication with a suction source, not depicted, that produces suction forces.

The delivery pad moving unit 171 is disposed on a front wall surface of the column 10A. The delivery pad moving unit 171 includes a ball screw 171*a* having an axis extending in the X-axis directions, a pair of guide rails 171*b* extending parallel to the ball screw 171*a* on both sides thereof, an electric motor 171*c* connected to an end of the ball screw 171*a* for rotating the ball screw 171*a* about its own axis, and a movable block 171*d* having an internal nut threaded over the ball screw 171*a* and held in sliding contact with the guide rails 171*b*. When the electric motor 171*c* rotates the ball screw 171*a* about its own axis, the movable block 171*d* moves in one of the X-axis directions while being guided by the guide rails 171*b*, moving the delivery pad 170 attached to the lower end of the lifting and lowering unit 172 in the X-axis directions.

The lifting and lowering unit 172, which includes an air cylinder, an electric cylinder, or the like, lifts and lowers the delivery pad 170 in the Z-axis directions.

A cleaning unit 18 is disposed below the path along which the delivery pad 170 is movable in the X-axis directions. The cleaning unit 18 is a single-workpiece cleaning device, for example. The cleaning unit 18 holds a processed work set WS delivered by the delivery unit 17 under suction on a spinner table 180 and cleans the workpiece W of the work set WS with a cleaning solution sprayed over the workpiece W by a cleaning nozzle 181 that swings over the spinner table 180.

As illustrated in FIG. 1, the dividing apparatus 1 includes a control unit 9 for controlling the dividing apparatus 1 in its entirety. For example, the control unit 9 includes a processing device such as a central processing unit (CPU) or the like and a storage device such as a read-only memory (ROM), etc. The processing device operates according to programs stored in the storage device to perform various control processes required to process workpieces W. The control unit 9 is electrically connected to the X-axis feed unit 21, the Y-axis feed unit 20, the power supply 302*a* that selectively energizes and de-energizes the lower illumination unit 302, the power supply of the upper illumination unit 82, and so on. Under the control of the control unit 9, the X-axis feed unit 21 process-feeds the chuck table 30, the Y-axis feed unit 20 index-feeds the chuck table 30, the power supply 302*a* selectively energizes and de-energizes the lower illumination unit 302, and the power supply of the upper illumination unit 82 selectively energizes and de-energizes the upper illumination unit 82.

Operation of the various components of the dividing apparatus 1 illustrated in FIG. 1 for processing a workpiece W on the chuck table 30 with a laser beam and determining whether or not kerfs or dividing grooves have been normally formed in the workpiece W will be described below.

The push-pull mechanism 193 illustrated in FIG. 1 pulls a work set WS out of the cassette 190 placed on the cassette table 191 and places the ring frame F of the work set WS on the centering guide 194. The guide rails of the centering guide 194 move toward each other in the X-axis directions and support the outer circumferential edge of the ring frame F, while at the same time the centering guide 194 centers the work set WS in alignment with the chuck table 30.

The centered work set WS is delivered to and placed on the holding surface 300*a* of the chuck table 300 from the centering guide 194. The fixing clamps 33 grip and secure the ring frame F to the holding surface 300*a*. Suction forces produced by the suction source 39 illustrated in FIG. 2 are transmitted through the suction channel 300c and the suction ports 300b to the holding surface 300a, enabling the chuck table 30 to hold the workpiece W under suction thereon through the dicing tape T. The center of the holding surface 300a of the chuck table 30 and the center of the workpiece W held under suction thereon are substantially aligned with each other.

Then, the positions of streets S of the workpiece W that provide a reference in forming kerfs in the workpiece W with a laser beam applied to the workpiece W are detected by an alignment unit, not depicted, of the dividing apparatus 1. Specifically, with the upper illumination unit 82 being energized, the image capturing unit 8 captures an image of the streets S on the face side Wa of the workpiece W. The alignment unit performs an image processing process such as pattern matching or the like on the captured image, and detects coordinate positions of the streets S of the workpiece W on the basis of the processed image.

Furthermore, the chuck table 30 is turned through a predetermined angle θ, making one parallel set of the crossing streets S parallel to the X-axis directions.

When the coordinate positions of the streets S are detected, the chuck table 30 is moved in one of the Y-axis directions to bring one of the streets S into positional alignment with the beam applying head 609 of the dividing unit 60. Specifically, the chuck table 30 is moved to position the central line of the street S directly below the focused spot of the laser beam applied by the beam applying head 609. Then, the focused spot of the laser beam converged by the condensing lens 609a is placed at a predetermined height or vertical position in thicknesswise directions of the workpiece W, e.g., the height or vertical position of the face side Wa of the workpiece W.

Generally, the workpiece W is demarcated by the streets S and patterned up to an outer circumferential edge thereof. When the workpiece W is divided, however, an excess outer circumferential edge region thereof is fragmented into offcuts such as triangular chips or the like to be discarded. According to the present embodiment, the excess outer circumferential edge region of the workpiece W, which will not make rectangular device chips, is processed by a laser beam to determine whether or not a kerf, i.e., a dividing groove, has been normally formed therein. Alternatively, a device region of the workpiece W, which will make rectangular device chips, i.e., a region of the workpiece W inward of the excess outer circumferential edge region, may be processed by a laser beam to determine whether or not a kerf has been normally formed therein.

The laser oscillator 601 illustrated in FIG. 1 oscillates a laser beam having a wavelength absorbable by the workpiece W, and the laser beam is focused and applied to the workpiece W from the face side Wa. As the workpiece W is process-fed in a −X-axis direction at a predetermined process-feeding speed, the laser beam is applied to the excess outer circumferential edge region of the workpiece W along the street S, thereby performing ablation on the resin layer J and the workpiece W to fully cut the workpiece W along the street S. In other words, a kerf K in the form of a straight groove having a predetermined length as illustrated in FIG. 2 is formed in the workpiece W along the street S, thereby fully cutting the workpiece W along the street S.

Figure 3:
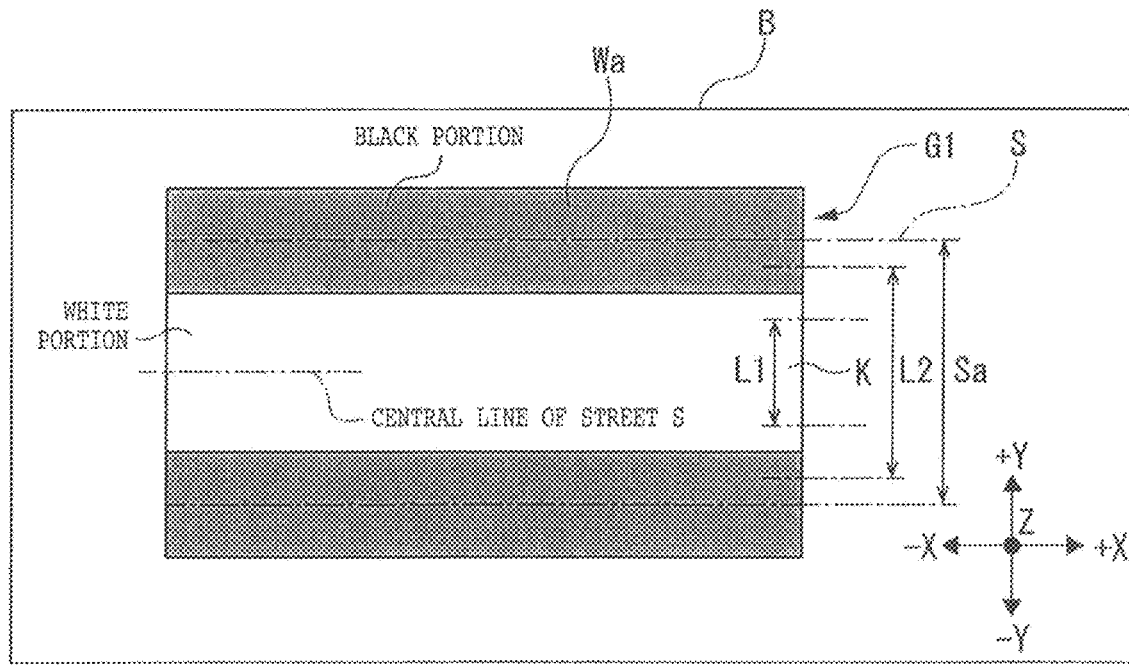
FIG. 3 is a diagram illustrating a first image G1 including the kerf captured by the image capturing unit while the lower illumination unit is being energized.

Then, the image capturing unit 8 illustrated in FIG. 2 captures an image of the kerf K that extends through the workpiece W from the face side Wa as the upper surface to the reverse side Wb. Specifically, while the image capturing unit 8 is being focused on the face side Wa of the workpiece W and the central line of the street S is being aligned with the optical axis of the image capturing unit 8, the lower illumination unit 302 is energized to emit illumination light, e.g., visible light, upwardly. The upper illumination unit 82 remains de-energized. The illumination light passes through the transparent plate 300, illuminating the workpiece W from the reverse side Wb side through the dicing tape T. Light that has passed through the kerf K and left the workpiece W upwardly is detected by the photodetectors of the image capturing device 83 through an optical system, not depicted. Now, the image capturing device 83 captures an image G1, hereinafter referred to as a "first image G1," that includes the kerf K, as illustrated in FIG. 3.

At this time, the image capturing device 83 may capture a plurality of first images G1.

The first image G1 represents a collection of pixels, each of a predetermined size, having luminance values in 8-bit grayscale levels, i.e., 256 grayscale levels in a range of 0 to 255 grayscale levels, for example. The luminance value of each pixel of the first image G1 is determined by the amount of light applied to a corresponding one of the pixels of the photodetectors of the image capturing device 83. Specifically, the amount of light applied to those photodetectors which correspond to the kerf K in the workpiece W illustrated in FIG. 2 is very large, and each of their pixels produces a luminance value close to 255, i.e., white, whereas the amount of light applied to those photodetectors which correspond to the portion of the face side Wa of the workpiece W other than the kerf K is almost nil as the illuminating light is blocked by the workpiece W, each of their pixels produces a luminance value close to 0, i.e., black.

The image capturing unit 8 sends the first image G1 representing the face side Wa of the workpiece W to the control unit 9 illustrated in FIG. 1. The first image G1 is stored in a first storage section 90 of the control unit 9 as illustrated in FIG. 1, the first storage section 90 including the storage device and the like.

The control unit 9 performs a binarizing process on the first image G1 stored in the first storage section 90 to convert those pixels whose luminance values are equal to higher than a predetermined threshold value into white and those pixels whose luminance values are lower than the predetermined threshold value into black. The image capturing unit 8 may have a larger field of vision for image capturing and may capture a first image covering a wider range than the first image G1 illustrated in FIG. 3.

As illustrated in FIG. 3, the first image G1 stored in the first storage section 90 is displayed on a hypothetical output screen B, for example, that has a predetermined resolution, i.e., on a coordinate plane defined by the X- and Y-axis directions that are perpendicular to each other. In the first image G1 displayed on the output screen B, the kerf K is displayed as a white portion where the light from the lower illumination unit 302 is transmitted through the workpiece W and expressed as white, i.e., displayed white as a collection of pixels having luminance values equal to or larger than the predetermined threshold value. The portion of the face side Wa of workpiece W other than the kerf K is displayed as a black portion where the light from the lower illumination unit 302 is blocked by the workpiece W and expressed as black, i.e., displayed black as a collection of pixels having luminance values smaller than the predetermined threshold value.

Figure 4:
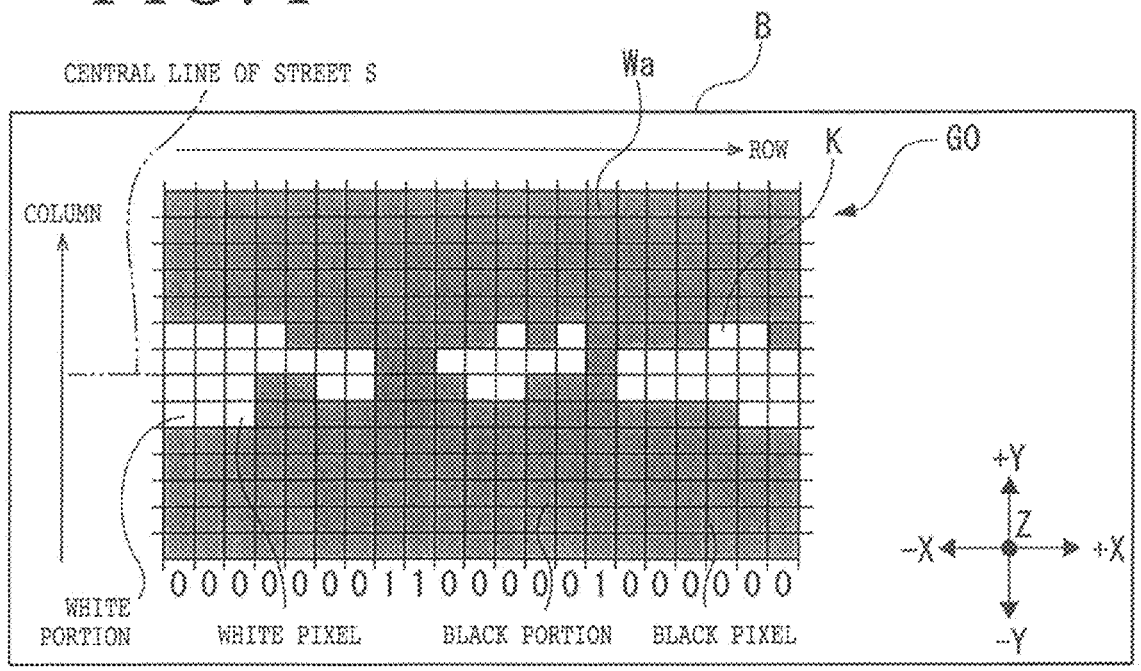
FIG. 4 is a diagram illustrating a binarized first image G0 including the kerf captured by the image capturing unit while the lower illumination unit is being energized.

It is assumed, for example, that a first image captured by the image capturing unit 8 and then binarized is a first image G0 illustrated in FIG. 4. A white pixel detecting section 98, illustrated in FIG. 1, of the control unit 9 detects whether or not there are pixels in the white portion of the first image G0 in the directions, i.e., the Y-axis directions, perpendicular to the directions, i.e., the X-axis directions, along which the street S extends. For example, rows of pixels are established in the X-axis directions along which the kerf K extends, whereas columns of pixels are established in the Y-axis directions perpendicular to the directions along which the kerf K extends in the horizontal plane. The white pixel detecting section 98 detects whether or not there are white pixels in the first image G0 along each of the columns. Since the first through seventh columns from the left end of the first image G0 in the −X-axis direction contain white pixels, for example, these columns are stored as presence columns (indicated by 0 in FIG. 4) where white pixels are present in the first storage section 90 illustrated in FIG. 1. Since the eighth and ninth columns from the left end of the first image G0 in the −X-axis direction do not contain white pixels, these columns are stored as absence columns (indicated by 1 in FIG. 4) where white pixels are absent in the first storage section 90. The white pixel detecting section 98 detects whether or not there are white pixels with respect to all the columns of the first image G0.

At the same time that the white pixel detecting section 98 detects whether or not there are white pixels in each column, a dividing section 97, illustrated in FIG. 1, of the control unit 1 decides whether the kerf K in each column is normal or defective. Specifically, the kerf K is normally formed in the first through seventh columns that contain white pixels from the left end of the first image G0 in the −X-axis direction. In other words, the deciding section 97 decides that the kerf K extends through the workpiece W from the face side Wa to the reverse side Wb in the first through seventh columns. On the other hand, the kerf K is defective in the eighth and ninth columns that are free of white columns from the left end of the first image G0 in the −X-axis direction. In other words, the deciding section 97 decides that the kerf K does not extend through the workpiece W from the face side Wa to the reverse side Wb in the eighth and ninth columns. The deciding section 97 decides whether the kerf K is normal or defective with respect to all the columns of the first image G0.

The deciding section 97 may calculate the number of columns where the kerf K is found defective, and may calculate the percentage of those columns in all the columns of the first image G0, for example. The deciding section 97 compares the calculated percentage with a decision value that is stored in the first storage section 90 in advance as representing a percentage at or beyond which it is decided that the kerf K displayed in the first image G0 is defectively formed as a whole. For example, the deciding section 97 decides that the kerf K displayed in the first image G0 illustrated in FIG. 4 is not normal but defective as a whole. In case there is even one column where the kerf K is found defective, the deciding section 97 may decide that the kerf K displayed in the first image G0 illustrated in FIG. 4 is not normally formed as a whole. For example, in case the kerf K is not displayed at all in the first image G0, i.e., in case the white pixel detecting section 98 fails to detect white pixels in all the columns, the deciding section 97 decides that the kerf K does not extend through the workpiece W at all and is defective. In case the deciding section 97 decides that there is even one column where no white pixel is detected and hence the kerf K is defective, the deciding section 97 may issue a warning or alert indicating that the dividing apparatus 1 is unable to perform a normal dividing process on the workpiece W. In response to the warning or alert, the worker who is in charge of the dividing apparatus 1 may examine the dividing apparatus 1, identify the cause of the defect of the kerf K, i.e., the cause of the occurrence of a region where laser ablation has failed to make the kerf K extend through the workpiece W between the face side Wa and the reverse side Wb, and take action to repair or otherwise improve the dividing apparatus 1.

(1) Mode 1 for Deciding Whether a Kerf is Normal or Defective with the First Deciding Section 92

Even if the dividing section 97 decides whether the kerf K is normal or defective with respect to the first image G1 illustrated in FIG. 3 and decides that the kerf K is normal, i.e., the kerf K extends through the workpiece W between the face side Wa and the reverse side Wb, for example, the dividing section 97 does not decide whether or not the kerf K is formed to a proper width. According to the present embodiment, a first deciding section 92, illustrated in FIG. 1, of the control unit 1 decides whether or not the kerf K is formed to a proper width.

As illustrated in FIG. 1, the control unit 9 includes a first measuring section 91 for counting pixels in the white portion of the first image G1 displayed on the output screen B in the directions, i.e., the Y-axis directions, perpendicular to the directions, i.e., the X-axis directions, along which the street S extends, and measuring the width of the white portion that is represented by the count as the width of the kerf K. The first storage section 90 stores a predetermined first width L1 and a predetermined second width L2 with respect to the width of the kerf K. The first width L1 and the second width L2 are experimentally, empirically, or theoretically selected values, and represent numerical values stored in the first storage section 90 for the first deciding section 92 to decide whether or not the kerf K is normally formed in the workpiece W. The first width L1 and the second width L2 are smaller than the width Sa of the street S, and the first width L1 is smaller than the second width L2.

The width Sa of the street S, the first width L1, and the second width L2 are displayed across the central line of the street S at center on the first image G1 illustrated in FIG. 3, for example.

The first width L1 and the second width L2 are determined depending on the length of a desired side of device chips to be divided from the workpiece W.

Figure 5:
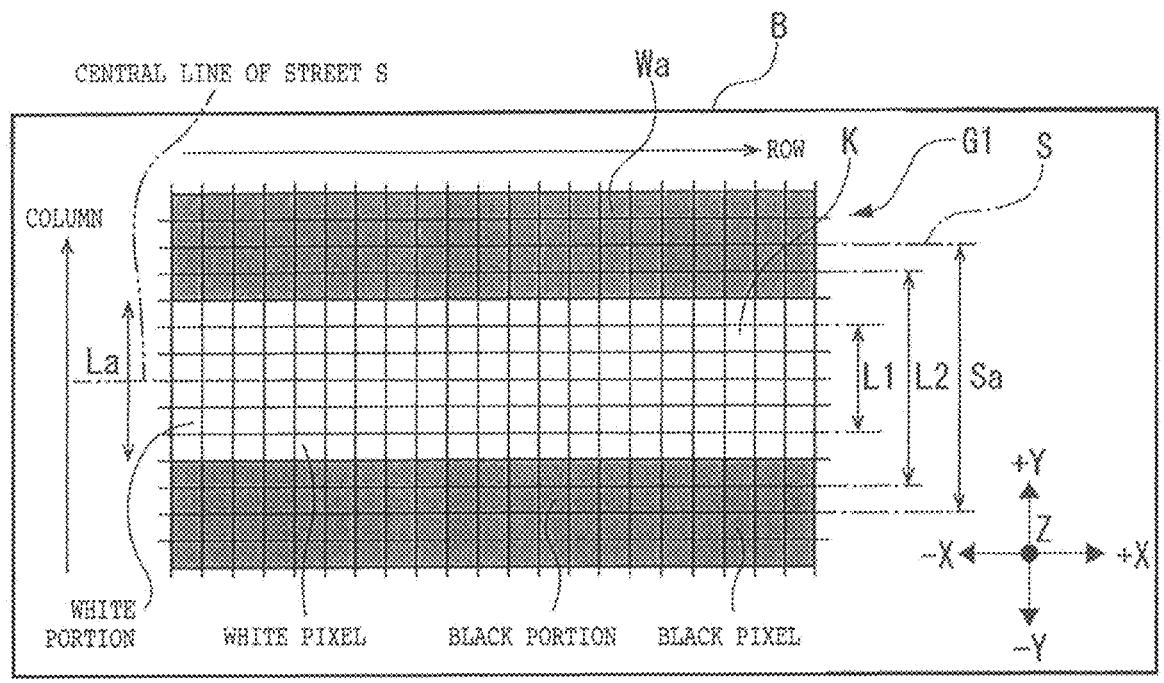
FIG. 5 is a diagram illustrating the first image G1 including the kerf captured by the image capturing unit while the lower illumination unit is being energized, with pixels in rows and columns added to the first image G1.

Furthermore, as illustrated in FIG. 5, rows of pixels are established in the X-axis directions along which the kerf K extends, whereas columns of pixels are established in the Y-axis directions perpendicular to the directions along which the kerf K extends in the horizontal plane. The first measuring section 91 calculates the number of pixels displayed as white for each column. As illustrated in FIG. 5, in the first image G1, the width of the white portion measured by the first measuring section 91, i.e., the width of the kerf K, is represented by a first measured width La of six pixels, for example. If one side of a pixel has a width of 10 μm, for example, then the first measured width La is of 60 μm.

Figure 6:
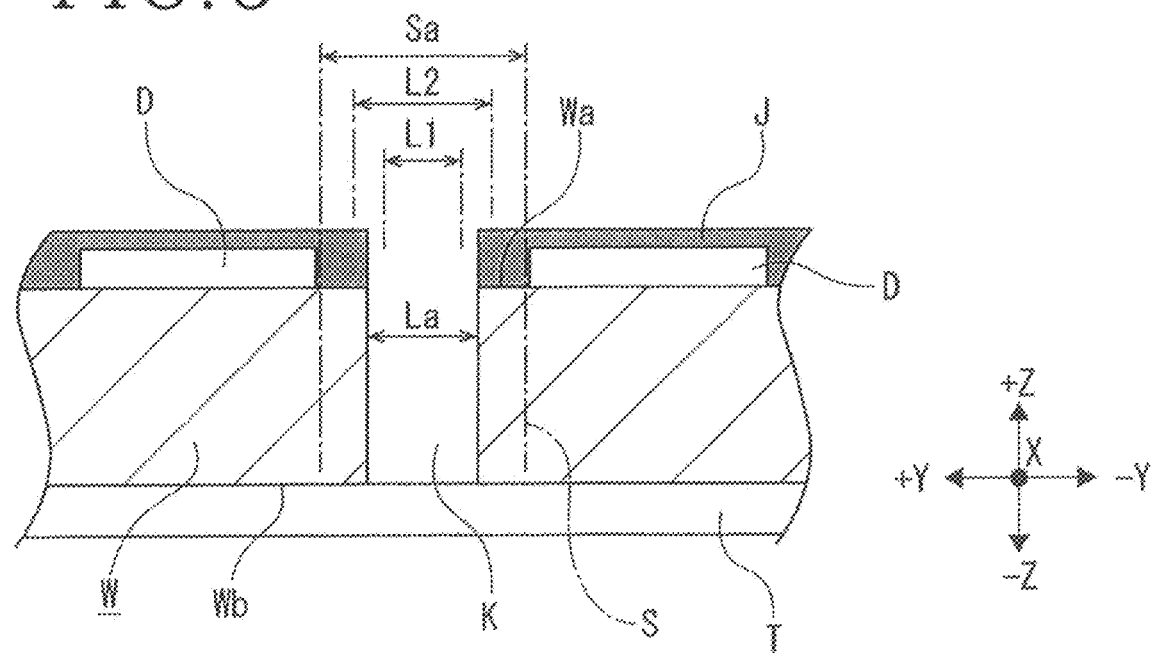
FIG. 6 is a fragmentary cross-sectional view illustrating a kerf that is normally formed.

Then, the first deciding section 92, illustrated in FIG. 1, of the control unit 9 decides that the first measured width La measured by the first measuring section 91 falls in the range from the preset first width L1 to the preset second width L2 and that the kerf K is normally formed. Specifically, as illustrated in FIG. 6, inasmuch as the kerf K that extends through the workpiece W from the face side Wa to the reverse side Wb is of the proper first measured width La and has its central line aligned with the central line of the street S, the first deciding section 92 decides that the kerf K is normally formed, extending through the workpiece W from the face side Wa to the reverse side Wb.

Figure 7:
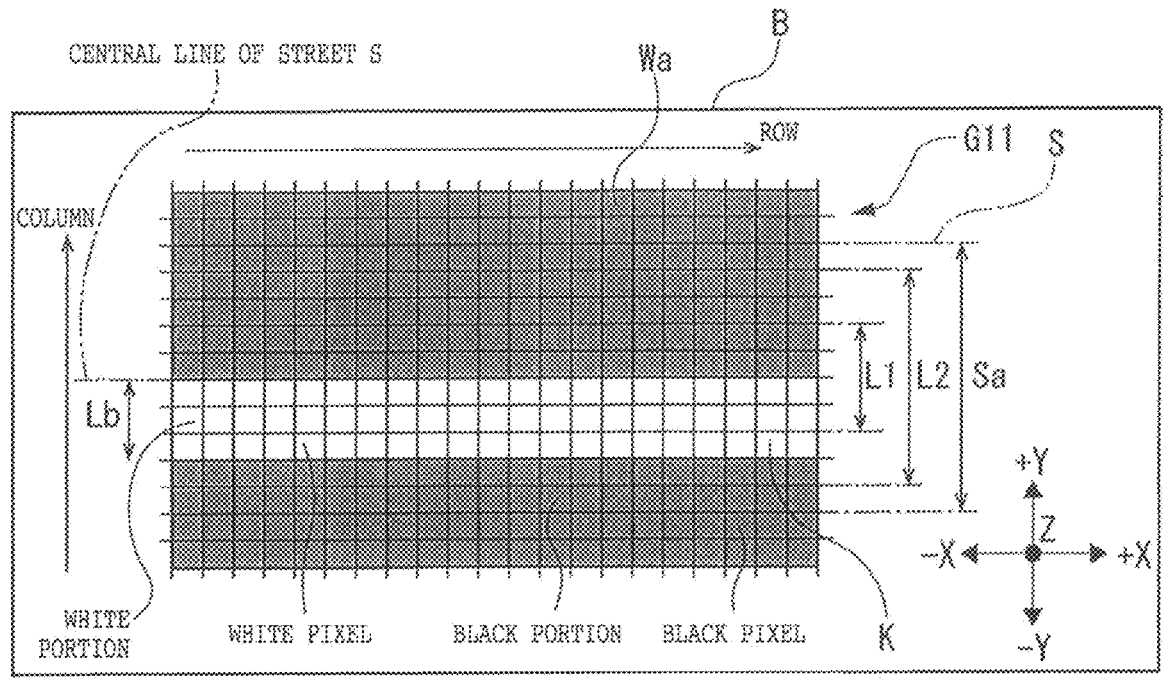
FIG. 7 is a diagram illustrating how to determine whether or not a kerf is normally formed in a workpiece or not from a first image G11 that includes the kerf captured by the image capturing unit while the lower illumination unit is being energized.
Figure 8:
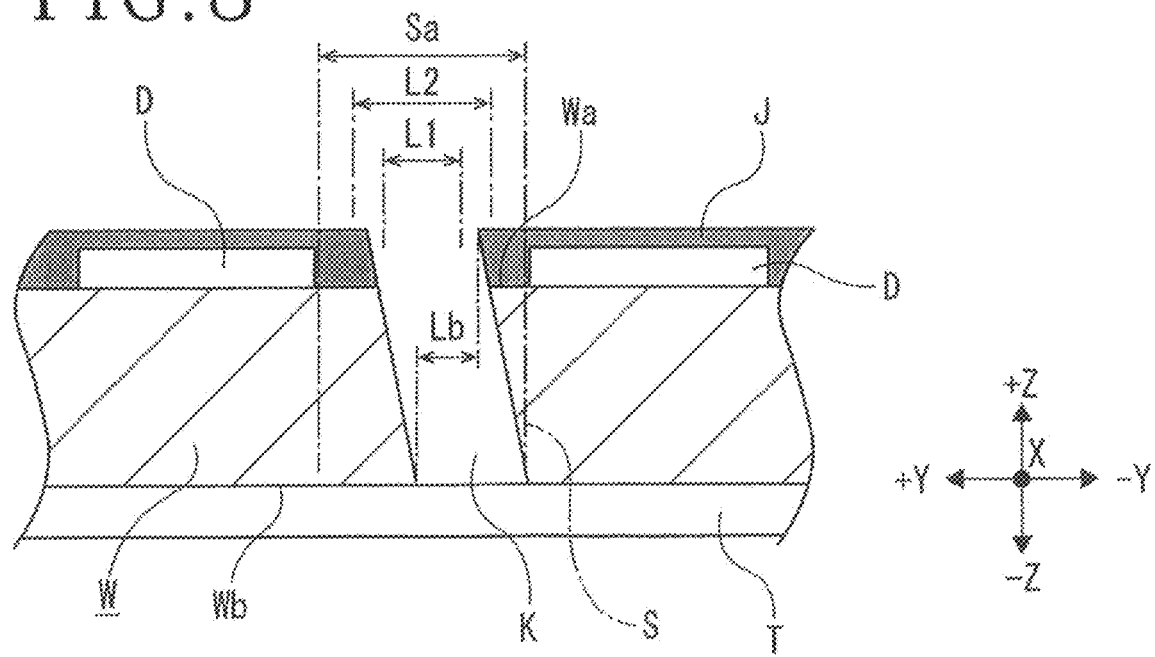
FIG. 8 is a fragmentary cross-sectional view illustrating a kerf that is not normally formed.

It is assumed, for example, that the first image captured by the image capturing unit 8 illustrated in FIG. 2 represents a first image G11 illustrated in FIG. 7. The first measuring section 91 calculates the number of pixels displayed as white for each column of the first image G11, and measures the width of the white portion that is represented by the calculated number as the width of the kerf K. In the first image G11, the width of the white portion measured by the first measuring section 91 is represented by a first measured width Lb of three pixels, for example. It can be presumed from the first measured width Lb of three pixels that more of the illuminating light from the lower illumination unit 302 is blocked by the workpiece W because the kerf K is formed obliquely from the face side Wa to the reverse side Wb of the workpiece W, as illustrated in FIG. 8, i.e., the kerf K is not normally formed in the workpiece W. Then, the first deciding section 92 illustrated in FIG. 1 decides that the first measured width Lb measured by the first measuring section 91 is smaller than the preset first width L1, and the kerf K is defective as it is not normally formed.

Figure 10:
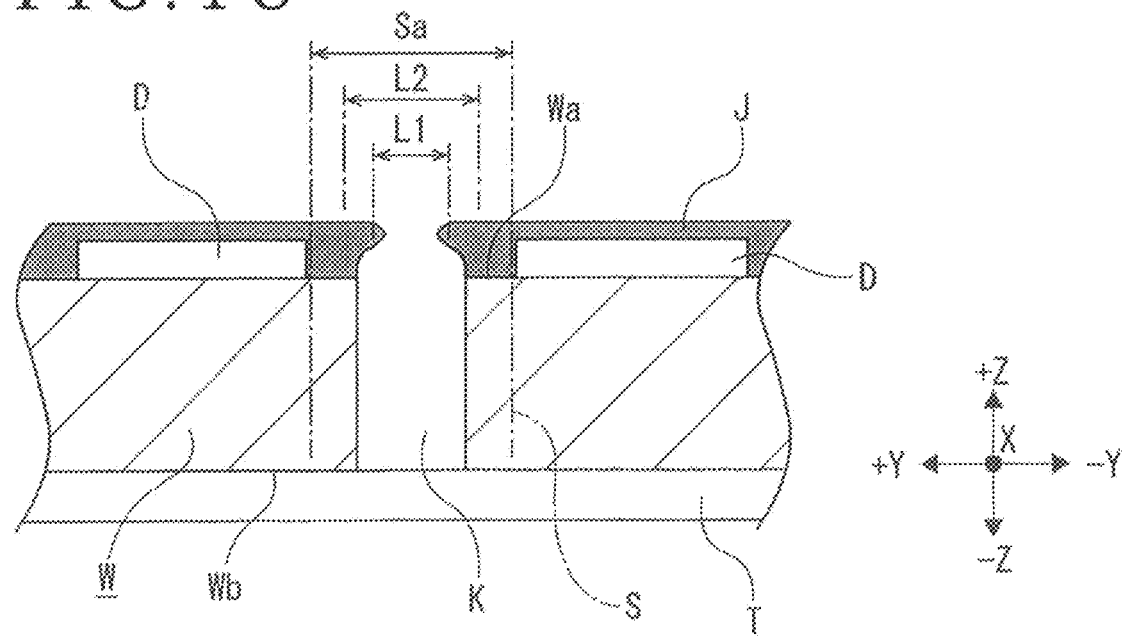
FIG. 10 is a fragmentary cross-sectional view illustrating a kerf that is not normally formed due to the flopping of a resin layer.

In case the face side Wa as the upper surface of the workpiece W illustrated in FIGS. 1 and 2 is encapsulated by the resin layer J and the resin layer J is divided by the laser beam applied thereto according to the present embodiment as described earlier, the resin layer J is liable to collapse into the kerf K due to the heat generated by laser ablation, as illustrated in FIG. 10. The resin layer J that has collapsed into the kerf K tends to block more of the illuminating light from the lower illumination unit 302. This phenomenon does not take place if the face side Wa of the workpiece W is not covered with the resin layer J.

Figure 9:
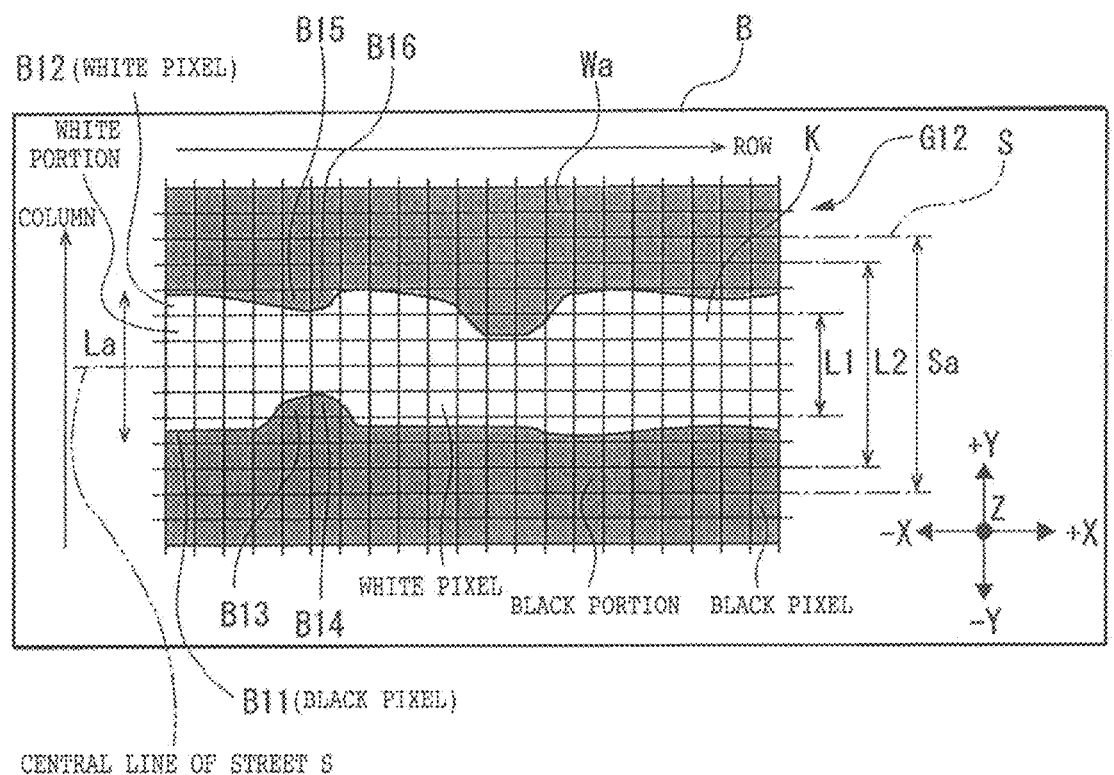
FIG. 9 is a diagram illustrating how to determine whether or not a kerf is normally formed in a workpiece or not from a second image G12 that includes the kerf captured by the image capturing unit while the lower illumination unit is being energized.

It is assumed, for example, that the first image captured by the image capturing unit 8 illustrated in FIG. 2 represents a first image G12 illustrated in FIG. 9. The first measuring section 91 calculates the number of pixels displayed as white for each column of the first image G12, and measures the width of the white portion that is represented by the calculated number as the width of the kerf K.

As the resin layer J has collapsed into the kerf K, the kerf K has an upper area in an irregularly bent shape. In the binarized first image G12, the kerf K is displayed such that pixels representing the resin layer J that has collapsed into the kerf K protrude into the kerf K in the Y-axis directions. Specifically, in the first image G12, the luminance value of a pixel B11 that belongs to the first column from the left end of the first image G12 in the −X-axis direction and the fifth row from the lower end of the first image G12 in the −Y-axis direction is smaller than the predetermined threshold value referred to above, and the pixel B11 is actually displayed black only in the first image G12. The luminance value of a pixel B12 that belongs to the first column from the left end of the first image G12 in the −X-axis direction and the tenth row from the lower end of the first image G12 in the −Y-axis direction is larger than the predetermined threshold value referred to above, and the pixel B12 is actually displayed white only in the first image G12.

The first measuring section 91 counts pixels that are displayed white in the first column of the first image G12 as five, i.e., five pixels in the sixth through tenth rows from the lower end of the first image G12 in the −Y-axis direction. If one side of a pixel has a width of 10 µm, for example, then the first measuring section 91 measures the width of the kerf K represented by the width of the white portion in the first column as a five-pixel width, i.e., 50 µm. The first deciding section 92 now decides that the width of the kerf K in the first column falls in the range from the preset first width L1 to the preset second width L2.

In addition, in the first image G12, the luminance values of pixels B13, B14, B15, and B16 that belong to the fifth and sixth columns from the left end of the first image G12 in the −X-axis direction and the sixth and tenth rows from the lower end of the first image G12 in the −Y-axis direction are smaller than the predetermined threshold value referred to above, and the pixels B13, B14, B15, and B16 are actually displayed black only in the first image G12. The first measuring section 91 counts pixels that are displayed white in the fifth and sixth columns of the first image G12 as three from the lower end of the first image G12 in the −X-axis direction. The first measuring section 91 measures the width of the kerf K represented by the width of the white portion in the fifth and sixth columns as a three-pixel width, i.e., 30 µm. The first deciding section 92 now decides that the width of the kerf K in the fifth and sixth columns is smaller than the preset first width L1.

After the first measuring section 91 has measured the width of the kerf K in each column and the first deciding section 92 has decided whether the width of the kerf K in each column falls in the range from the first width L1 to the second width L2, with respect to all the columns using the first image G12, as described above, the first deciding section 92 calculates the number of columns where the width of the kerf K falls in the range from the first width L1 to the second width L2 and calculates the percentage of those columns in the number of all columns of the first image G12. Then, the first deciding section 92 compares the calculated percentage with a decision value stored in the first storage section 90 in advance as representing a percentage at or beyond which it is decided that the kerf K displayed in the first image G12 is normally formed. As a result, the first deciding section 92 decides that the kerf K displayed in the first image G12 illustrated in FIG. 9 is not normally formed, but defective. Specifically, the first deciding section 92 decides that the kerf K is defective as the resin layer J collapses into the kerf K, for example, as illustrated in FIG. 10.

In case the first deciding section 92 illustrated in FIG. 1 decides that the kerf K is defective like the kerf K illustrated in FIG. 7 or FIG. 9, for example, the first deciding section 92 may issue a warning or alert indicating that the dividing apparatus 1 is unable to perform a normal dividing process on the workpiece W. In response to the warning or alert, the worker may examine the dividing apparatus 1, identify the cause of the defect of the kerf K, and take action to repair or otherwise improve the dividing apparatus 1.

(2) Mode 2 for Deciding Whether a Kerf is Normal or Defective with the First Deciding Section 92

The first deciding section 92 may decide whether the kerf K is normal or defective according to a deciding mode 2 to be described below, rather than the deciding mode 1.

For example, the width Sa of the street S, the first width L1, and the second width L2 are displayed on the first image G1 illustrated in FIG. 5.

For example, the first measuring section 91 counts pixels of the white portion representing the kerf K in the first image G1 and calculates their sum total as a total area S1 of the kerf K in the first image G1. Furthermore, the first measuring section 91 counts pixels of the black portion in the first image G1 and calculates their sum total as a total area S2 of the black portion.

Moreover, the first measuring section 91 measures the width of the white portion, i.e., a first measured width La of the kerf K, from the area ratio between the total area S1 of the white portion of the first image G1 and the total area S2 of the black portion thereof. The first deciding section 92 decides that the first width La measured by the first measuring section 91 falls in the range from the preset first width L1 to the preset second width L2, and that the kerf K is normally formed.

It is assumed, for example, that the first image captured by the image capturing unit 8 represents the first image G11 illustrated in FIG. 7. The first measuring section 91 counts pixels of the white portion representing the kerf K in the first image G11 and calculates their sum total as a total area S3 of the kerf K in the first image G11. Furthermore, the first measuring section 91 counts pixels of the black portion in the first image G11 and calculates their sum total as a total area S4 of the black portion. Moreover, the first measuring section 91 measures a first measured width Lb of the kerf K from the area ratio between the total area S3 of the white portion of the first image G11 and the total area S4 of the black portion thereof. The first deciding section 92 decides that the first width Lb measured by the first measuring section 91 is smaller than the preset first width L1 and that the kerf K is not normally formed, but defective.

The dividing apparatus 1 according to the present embodiment decides whether the kerf K is normal or defective, i.e., whether or not the kerf K extends through the workpiece W between the upper and lower surfaces thereof and has an appropriate width, and also decides whether the kerf K is formed vertically from the face side Wa as the upper surface of the workpiece W to the reverse side Wb as the lower surface thereof or is formed obliquely.

Figure 11:
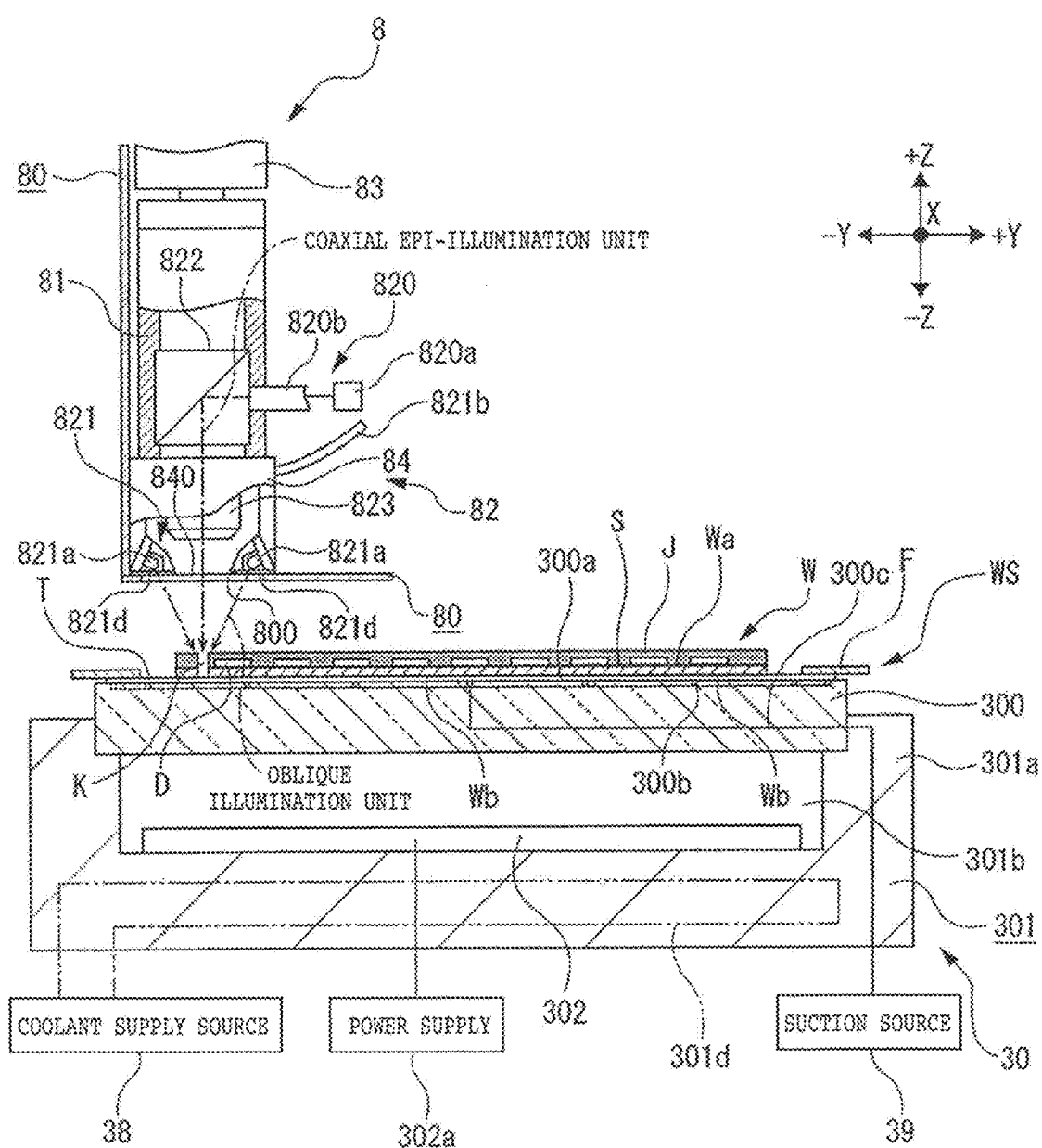
FIG. 11 is a cross-sectional view of the portion of the dividing apparatus, illustrating the manner in which an upper area of a kerf in a workpiece is imaged by the image capturing unit while the lower illumination unit is being de-energized and an upper illumination unit is being energized.

In order to make the decision, an image of the kerf K formed in the face side Wa as the upper surface of the workpiece W is captured by the image capturing unit 8 illustrated in FIG. 11. Specifically, while the image capturing unit 8 is being focused on the face side Wa of the workpiece W and the central line of the street S, i.e., the street S involved at the time the first image is captured, is being aligned with the optical axis of the image capturing unit 8, the lower illumination unit 302 is de-energized and the upper illumination unit 82 is energized to emit illumination light toward the workpiece W.

According to the present embodiment, the coaxial epi-illumination unit 820 illuminates the face side Wa of the workpiece W directly from above through the half-silvered mirror 822, and the oblique illumination unit 821 illuminates the face side Wa of the workpiece W obliquely from above. The illumination light from the oblique illumination unit 821 is set to a stronger level than the illumination light from the coaxial epi-illumination unit 820. Specifically, for example, the illumination light from those light emitters 821a of the oblique illumination unit 821 along the X-axis directions illustrated in FIG. 11 is set to a stronger level. As a result, reflected light from the face side Wa of the workpiece W is received and detected by the image capturing device 83 through the objective lens 823, which captures an image including the upper area of the kerf K. Specifically, the captured image that includes the kerf K when taken from above the workpiece W represents a second image G2 illustrated in FIG. 12 in which the kerf K appears as a black portion.

The second image G2 is stored in a second storage section 93 of the control unit 9 as illustrated in FIG. 1 the second storage section 93 including the storage device and the like.

Figure 12:
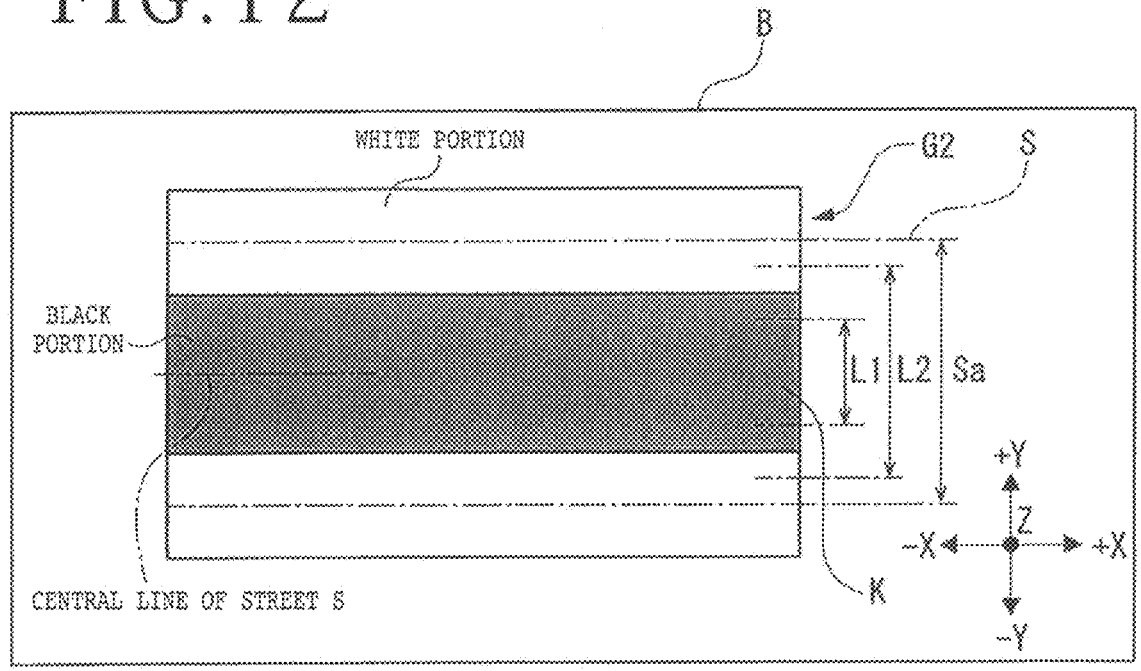
FIG. 12 is a diagram illustrating a second image G2 including the upper area of the kerf captured by the image capturing unit while the lower illumination unit is being de-energized and an upper illumination unit is being energized.

It is assumed, for example, that the first image is captured as the first image G11 illustrated in FIG. 7 by the image capturing unit 8 and then the second image G2 illustrated in FIG. 12 is captured by the image capturing unit 8.

Figure 13:
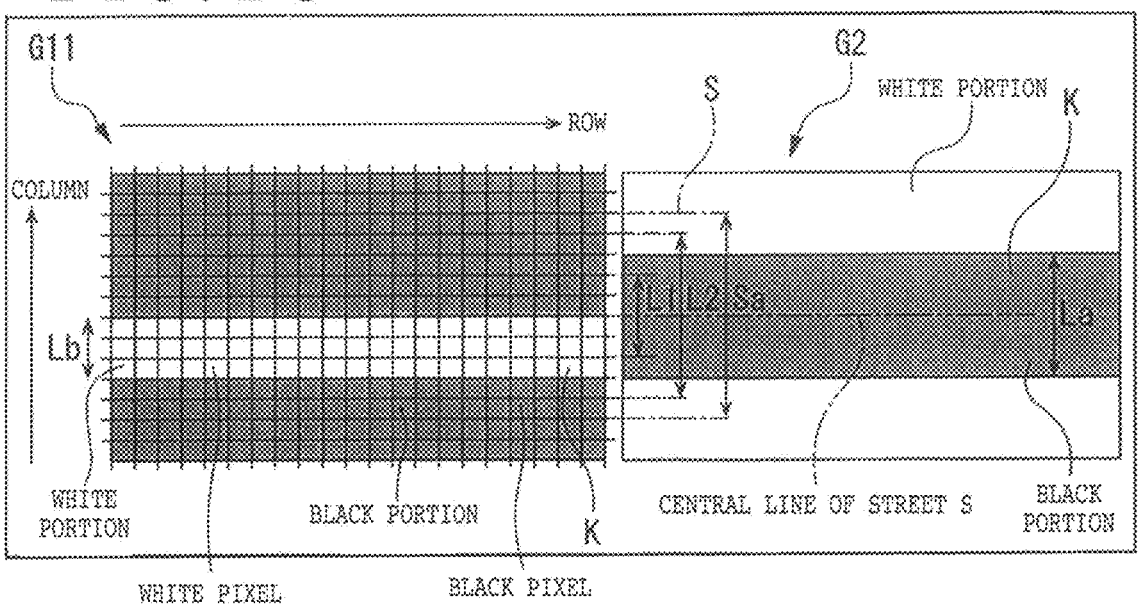
FIG. 13 is a diagram illustrating the manner in which a second deciding section determines whether the kerf is formed vertically or obliquely from an upper surface, i.e., a face side, to a lower surface, i.e., a reverse side, of the workpiece.

For example, a binarizing process is performed on the second image G2 stored in the second storage section 93 to convert those pixels whose luminance values are equal to higher than a predetermined threshold value into white and those pixels whose luminance values are lower than the predetermined threshold value into black. Thereafter, for example, the binarized second image G2 is displayed along with the first image G11 on the output screen B, as illustrated in FIG. 13.

As illustrated in FIG. 1, for example, the control unit 9 includes a second measuring section 94 for counting pixels in the black portion of the second image G2 displayed on the output screen B in the directions, i.e., the Y-axis directions, perpendicular to the directions, i.e., the X-axis directions, along which the street S extends, and measuring the width of the black portion that is represented by the count as the width of the kerf K in the face side Wa as the upper surface of the workpiece W.

The second measuring section 94 measures the width of the kerf K in the face side Wa as the upper surface of the workpiece W as the width La. The width La which is appropriate has a midpoint positioned on the central line of the street S.

As illustrated in FIG. 1, the control unit 9 includes a second deciding section 95 for deciding whether the kerf K is formed vertically from the face side Wa as the upper surface of the workpiece W to the reverse side Wb as the lower surface thereof or is formed obliquely on the basis of the measured result from the first measuring section 91 and the measured result from the second measuring section 94.

The second deciding section 95 decides that the upper area of the kerf K is normally formed in a proper position with a proper width in the surface Wa of the workpiece W because the kerf K is formed with the appropriate width La, i.e., the width La of six pixels, and the central line aligned with the central line of the street S.

Figure 14:
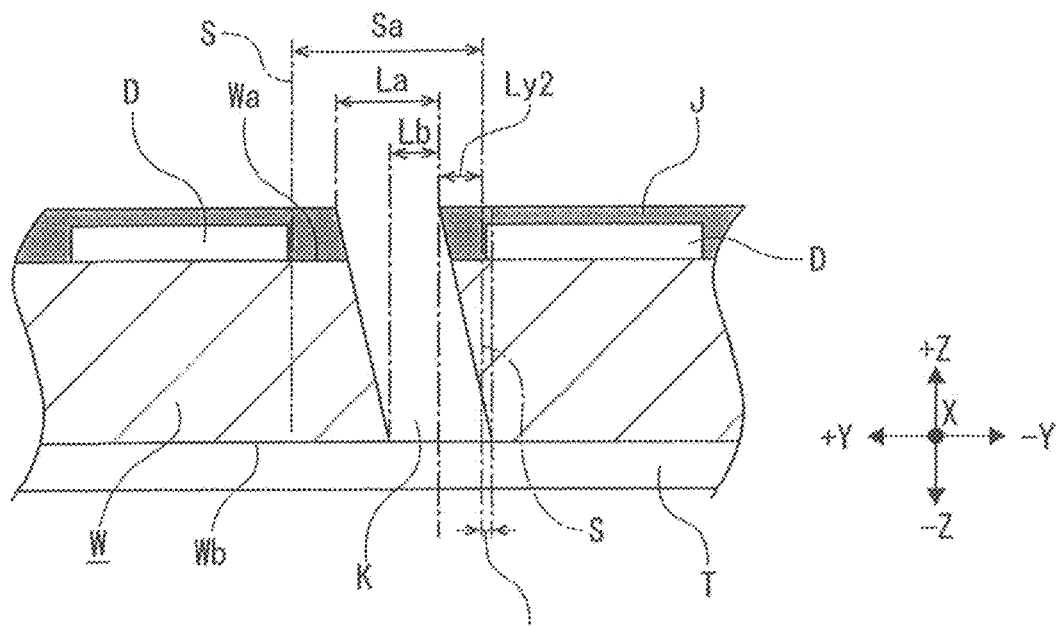
FIG. 14 is a fragmentary cross-sectional view illustrating a kerf that is not formed vertically from the upper surface to the lower surface of the workpiece, but formed obliquely in Y-axis directions.

Furthermore, the second deciding section 95 decides that the kerf K is not formed vertically as illustrated in FIG. 14, but formed obliquely toward the +Y-axis direction from the face side Wa as the upper surface of the workpiece W to the reverse side Wb as the lower surface thereof, because the kerf K, displayed in the first image G11 illustrated in FIG. 13, having the first measured width Lb of three pixels appears shifted in the −Y-axis direction across the central line of the street S from the upper area of the kerf K, displayed in the second image G2, having the width La of six pixels and the central line aligned with the central line of the street S.

The control unit 9 of the dividing apparatus 1 according to the present embodiment includes a third deciding section 96 illustrated in FIG. 1 for deciding whether or not the upper and lower areas of the kerf K can be brought into the width of the street S even though the kerf K has the gradient illustrated in FIG. 14 when the second deciding section 95 decides that the kerf K is formed obliquely.

The third deciding section 96 initially decides whether the lower area of the kerf K falls in the width Sa of the street S or not. Specifically, the third deciding section 96 decides that the lower area of the kerf K does not fall in the width Sa of the street S as illustrated in FIG. 14. Then, the third deciding section 96 calculates a stick-out distance Ly1 by which the lower area of the kerf K protrudes from the width Sa of the street S sticks out of the width Sa of the street S. If the stick-out distance Ly1 is equal to or smaller than a distance Ly2 from an end of the upper area of the kerf K in the −Y-axis direction to an end of the street S in the −Y-axis direction, then the third deciding section 96 decides that the upper and lower areas of the kerf K can be brought into the width Sa of the street S, and stores a corrective quantity in the Y-axis directions, i.e., the index-feeding directions, for a dividing process to be performed on the workpiece W. The corrective quantity represents a desired distance Ly3 (see FIG. 15) in the range from the stick-out distance Ly1 to the distance Ly2 from the end of the upper area of the kerf K in the −Y-axis direction to the end of the street S in the −Y-axis direction.

On the other hand, if the stick-out distance Ly1 exceeds the distance Ly2, then the third deciding section 96 decides that the upper and lower areas of the kerf K cannot be brought into the width Sa of the street S. In this case, the third deciding section 96 may issue a warning or alert indicating that the dividing apparatus 1 is unable to perform a normal dividing process on the workpiece W.

After whether the kerf K in the excess outer circumferential edge region of the workpiece W is normal or defective, etc. has been decided as described above, a dividing process is performed on the workpiece W to divide the workpiece W into device chips, as follows:

Since the coordinate positions of the streets S of the workpiece W have already been recognized by the alignment process described above, the chuck table 30 illustrated in FIG. 1 is moved in the Y-axis directions to position one of the streets S in alignment with the beam applying head 609 of the dividing unit 60. For example, the chuck table 30 is moved to position the central line of the street S directly below the focused spot of the laser beam applied by the beam applying head 609. After the street S has been positioned, a Y-axis control process is carried out to move the chuck table 50 to a position offset by the distance Ly3 illustrated in FIG. 15 in the +Y-axis direction, which is represented by the corrective quantity calculated previously, thereby bringing the upper and lower areas of the kerf K into the width Sa of the street S.

Figure 15:
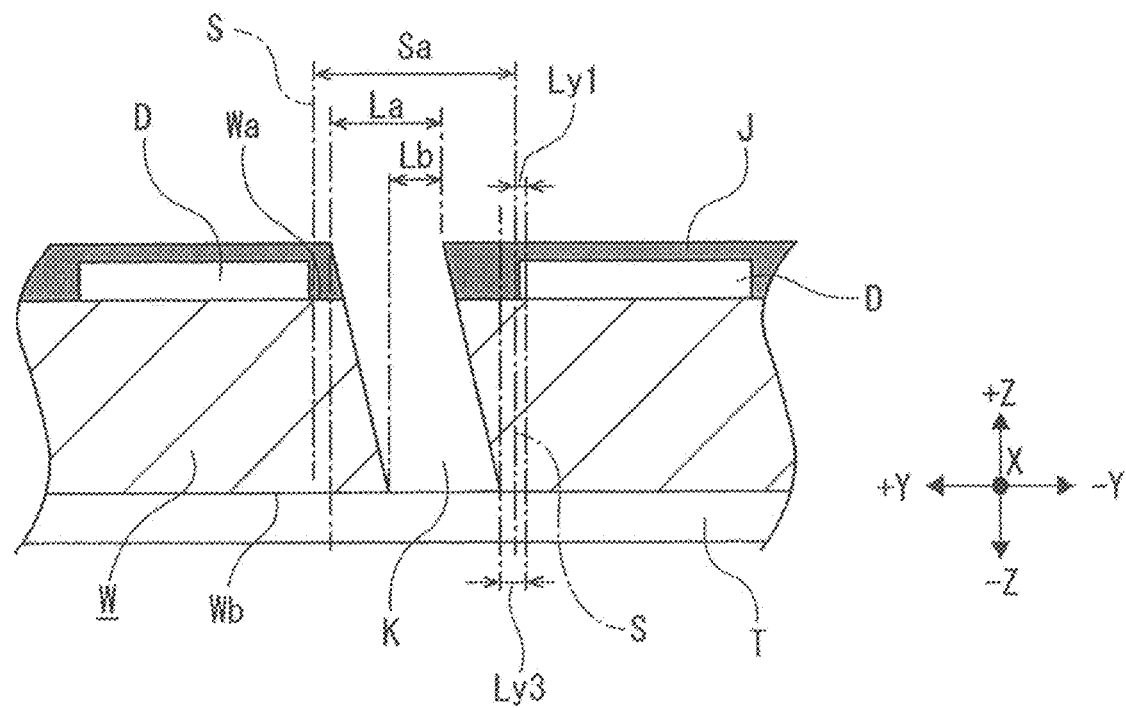
FIG. 15 is a fragmentary cross-sectional view illustrating the manner in which a third deciding section decides that upper and lower areas of a kerf can be brought into the width of a street, and the kerf whose upper and lower areas are positioned in the width of the street is formed by performing a Y-axis control process for moving a chuck table and a dividing unit relatively in the Y-axis directions in order to bring the upper and lower areas of the kerf into the width of the street.

Then, the position of the focused spot of the laser beam condensed by the condensing lens 609a is aligned with a height or vertical position in thicknesswise directions of the workpiece W, e.g., the height or vertical position of the face side Wa of the workpiece W. Thereafter, the laser oscillator 601 illustrated in FIG. 1 oscillates the laser beam having the wavelength absorbable by the workpiece W, and the laser beam is focused and applied to the workpiece W from the face side Wa. The workpiece W is process-fed in the −X-axis direction at the predetermined process-feeding speed, and the laser beam is applied to the workpiece W along the street S, thereby performing ablation on the resin layer J and the workpiece W to fully cut the workpiece W along the street S with a formed kerf K. The upper and lower areas of the formed kerf K enter the width Sa of the street S as illustrated in FIG. 15.

When the workpiece W has moved in the −X-axis direction to a predetermined position where the laser beam is to stop being applied along the street S, the laser beam stops being applied. Then, the chuck table 30 is moved in one of the Y-axis directions, positioning a street S next to the street S along which the laser beam has been applied as the workpiece W is process-fed in the −X-axis direction into alignment with the beam applying head 609 in the Y-axis direction, while at the same time correcting the position of the workpiece W by moving same in the Y-axis directions by the distance Ly3. Thereafter, the laser beam is applied to the workpiece W along the street S, fully cutting the workpiece W along the street S with a formed kerf K. Then, the laser beam is applied to the workpiece W along all the streets S extending in the X-axis directions, after which the chuck table 30 is turned 90 degrees, and the laser beam is applied to the workpiece W along the remaining streets S. In this manner, the workpiece W is divided along all the streets S into individual device chips.

As described above, the dividing apparatus 1 according to the present invention has the chuck table 30 including the transparent plate 300 made of a transparent material and having the upper surface and the suction ports providing fluid communication between the holding surface 300a and the upper source to cause the upper surface to function as the holding surface 300a, the base 301 supporting the transparent plate 300 thereon, and the lower illumination unit 302 disposed between the transparent plate 300 and the base 301 for illuminating the holding surface 300a. The dividing apparatus 1 also includes the first storage section 90 for storing a first image including a white portion where illumination light from the lower illumination unit 302 is transmitted through the workpiece W and displayed as white and a black portion where the illumination light is blocked by the workpiece W and displayed as black when an image of the kerf K defined in the excess outer circumferential edge region of the workpiece W held on the holding surface 300a by the dividing unit 60 is captured by the image capturing unit 8 with the lower illumination unit 302 being energized, the white pixel detecting section 98 for detecting whether or not there are pixels in the white portion of the first image in the directions perpendicular to the directions along which the street S extends, and the deciding section 97 for deciding that the kerf K is defective if the white pixel detecting section 98 does not detect white pixels and the kerf K is formed normally if the white pixel detecting section 98 detects white pixels. It is thus possible to confirm whether or not the kerf K defined in the workpiece W held on the chuck table 30 extends through the workpiece W between the upper and lower surfaces thereof. Thereafter, a dividing process is performed on the workpiece W along the streets S. The dividing process is thus prevented from becoming defective.

The dividing apparatus 1 includes the first measuring section 91 for counting pixels in the white portion of the first image in the directions perpendicular to the directions in which the street S extends and measuring the width of the white portion, and the first deciding section 92 for deciding that the kerf K is defective if the first measured width measured by the first measuring section 91 is smaller than the preset first width L1, that the kerf K is defective if the first measured width exceeds the preset second width L2, and that the kerf K is formed normally if the first measured width is in the range from the preset first width L1 to the preset second width L2. It is thus possible to confirm whether or not the kerf K defined in the excess outer circumferential region, for example, of the workpiece W held on the chuck table 30 extends through the workpiece W between the upper and lower surfaces thereof and whether the kerf K is formed with an appropriate width. Thereafter, an appropriate dividing process can be performed on the workpiece W using the decided results.

Furthermore, the dividing apparatus 1 according the present invention includes the upper illumination unit 82 for illuminating the workpiece W held on the chuck table 30 from above the workpiece W, the second storage section 93 for storing a second image including a black portion that represents the kerf K displayed black when an image of the kerf K is captured by the image capturing unit 8 from above the workpiece while the upper illumination unit 82 is being energized and the lower illumination unit 302 is being de-energized, the second measuring section 94 for counting pixels in the black portion of the second image in the directions perpendicular to the directions along which the street S extends and measuring the width of the kerf K in the upper surface of the workpiece W, and the second deciding section 95 for deciding whether the kerf K is formed vertically from the upper surface of the workpiece W to the lower surface thereof or is formed obliquely on the basis of the measured result from the first measuring section 91 and the measured result from the second measuring section 94. It is thus possible to confirm, prior to a process of actually dividing the workpiece W into device chips, for example, whether or not the kerf K is formed vertically in the workpiece W held on the chuck table 30 from the upper surface as the face side Wa of the workpiece W to the lower surface as the reverse side Wb thereof.

The dividing apparatus 1 also includes the third deciding section 96 for deciding whether or not the upper and lower areas of the kerf K can be brought into the width Sa of the street S even though the kerf K has the gradient when the second deciding section 95 decides that the kerf K is formed obliquely. If the third deciding section 96 decides that the upper and lower areas of the kerf K can be brought into the width Sa of the street S, the Y-axis control process is performed for moving the chuck table 30 and the dividing unit 60 relatively in the Y-axis directions in order to bring the upper and lower areas of the kerf K into the width Sa of the street S. Therefore, the upper and lower areas of the kerf K are brought into the width Sa of the street S of the workpiece W held on the chuck table 30, making it possible for the dividing unit 60 to process the workpiece W.

The dividing apparatus 1 according to the present invention is not limited to the above embodiment, but may be implemented in various different forms within the technical concept of the invention. For example, the dividing unit 60 is not limited to the laser processing unit described above, but may be a cutting unit having a spindle on which there is mounted an annular cutting blade made up of abrasive grains bound together by a bonding agent. The shapes, etc. of the components of the dividing apparatus 1 illustrated in the accompanying drawings are not limited to those illustrated, but may be changed or modified within the scope of the invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A dividing apparatus comprising:
a chuck table having a holding surface for holding thereon a workpiece including devices formed in respective areas demarcated by streets;
a dividing unit for forming kerfs in the workpiece along the streets while the workpiece is being held on the chuck table to fragmentize the workpiece into device chips;
an X-axis feed unit for process-feeding the chuck table and the dividing unit relatively in X-axis directions parallel to directions along which the streets extend;
a Y-axis feed unit for index-feeding the chuck table and the dividing unit relatively in Y-axis directions perpendicular to the X-axis directions in a horizontal plane;
an image capturing unit for capturing an image of at least one of the kerfs from above the workpiece held on the chuck table;
wherein the chuck table includes a transparent plate made of a transparent material and having an upper surface and suction ports providing fluid communication between the upper surface and a suction source to cause the upper surface to function as a holding surface, a base supporting the transparent plate thereon, and a lower illumination unit disposed between the transparent plate and the base for illuminating the holding surface;
a first storage section for storing a first image including a white portion where illumination light from the lower illumination unit is transmitted through the workpiece and displayed as white and a black portion where the illumination light is blocked by the workpiece and displayed as black when an image of a kerf defined by the dividing unit in the workpiece held on the holding surface is captured by the image capturing unit with the lower illumination unit being energized;
a white pixel detecting section for detecting whether or not there are pixels in the white portion of the first image in directions perpendicular to directions along which a street extends; and
a deciding section for deciding that the kerf is defective if the white pixel detecting section does not detect white pixels and the kerf is formed normally if the white pixel detecting section detects white pixels,
a first measuring section for counting pixels in the white portion of the first image in the directions perpendicular to the directions in which the street extends and measuring the width of the white portion; and
a first deciding section for deciding that the kerf is defective if a first measured width measured by the first measuring section is smaller than a preset first width, that the kerf is defective if the first measured width exceeds a preset second width, and that the kerf is formed normally if the first measured width is in the range from the preset first width to the preset second width;
an upper illumination unit for illuminating the workpiece held on the chuck table from above the workpiece;
a second storage section for storing a second image including a black portion that represents the kerf displayed black when an image of the kerf is captured by the image capturing unit from above the workpiece while the upper illumination unit is being energized and the lower illumination unit is being de-energized;
a second measuring section for counting pixels in the black portion of the second image in the directions perpendicular to the directions along which the street extends and measuring the width of the kerf in the upper surface of the workpiece; and
a second deciding section for deciding whether the kerf is formed vertically from the upper surface of the workpiece to the lower surface thereof or is formed obliquely on the basis of the measured result from the first measuring section and the measured result from the second measuring section.

2. The dividing apparatus according to claim 1, further comprising:
a third deciding section for deciding whether or not upper and lower areas of the kerf can be brought into the width of the street even though the kerf has a gradient when the second deciding section decides that the kerf is formed obliquely;
wherein if the third deciding section decides that the upper and lower areas of the kerf can be brought into the width of the street, a Y-axis control process is performed for moving the chuck table and the dividing unit relatively in the Y-axis directions in order to bring the upper and lower areas of the kerf into the width of the street.

3. The dividing apparatus according to claim 2, wherein the first storage section stores the first image prior to a process of actually dividing the workpiece, the second storage section stores the second image prior to the process of actually dividing the workpiece, and the third deciding section decides whether or not upper and lower areas of the kerf can be brought into the width of the street even though the kerf has a gradient prior to the process of actually dividing the workpiece;

wherein if the third deciding section decides that the upper and lower areas of the kerf can be brought into the width of the street, the Y-axis control process is performed for moving the chuck table and the dividing unit relatively in the Y-axis directions in order to bring the upper and lower areas of the kerf into the width of the street prior to the process of actually dividing the workpiece.

4. The dividing apparatus according to claim 1, wherein the first storage section stores the first image when an image of a kerf in an excess outer circumferential edge region of the workpiece is captured by the image capturing unit with the lower illumination unit being energized and the second storage section stores the second image when an image of the kerf in the excess outer circumferential edge region of the workpiece is captured by the image capturing unit while the upper illumination unit is being energized and the lower illumination unit is being de-energized.

\* \* \* \* \*